(12) United States Patent
Ferrer et al.

(10) Patent No.: US 8,249,841 B1
(45) Date of Patent: Aug. 21, 2012

(54) COMPUTERIZED TOOL FOR ASSESSING CONDITIONS IN A ROOM

(75) Inventors: Ernesto J. Ferrer, Aquadilla, PR (US); Carlos E. Ramirez, San Sebastian, PR (US); Marcos A. Batista, Cabo Rojo, PR (US); Christian J. Bonilla, Vega Baja, PR (US); Cullen E. Bash, Los Gatos, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1137 days.

(21) Appl. No.: 11/699,402

(22) Filed: Jan. 29, 2007

(51) Int. Cl.
*G06G 7/50* (2006.01)
(52) U.S. Cl. .............................. 703/9; 703/2
(58) Field of Classification Search .................. 703/2, 6, 703/9, 18; 702/132; 361/691, 695; 454/184; 700/300
See application file for complete search history.

(56) References Cited

U.S. PATENT DOCUMENTS
5,384,716 A * 1/1995 Araki et al. .................. 702/134

OTHER PUBLICATIONS

Patel, C.D., Bash, C.E., Belady, C., Stahl, L.,Sullivan, D., "Computational Fluid Dynamics Modeling of High Compute Density Data Centers to Assure System Inlet Air Specifications", Jul. 2001, Proceedings of IPACK'01—The PacificRim/ASME International Electronics Packaging Technical Conference and Exhibition, Kauai, Hawaii, 9 pages.*

* cited by examiner

*Primary Examiner* — Kamini S Shah
*Assistant Examiner* — Luke Osborne

(57) ABSTRACT

A computerized tool for assessing conditions in a room includes a data extraction module for at least one of modeling and extracting environmental condition data of a room and a layout module for calculating a layout of the room from the environmental condition data. The computerized tool may also include a temperature module for at least one of modeling and extracting temperature data in the room and a thermal profile module for calculating a thermal profile of the room from the temperature data. The thermal profile may be overlayed on the calculated layout to thus enable the relationship between the thermal profile and the room layout to be visualized.

18 Claims, 9 Drawing Sheets

COMPUTERIZED TOOL FOR ASSESSING CONDITIONS IN A ROOM

BACKGROUND

A data center may be defined as a location, for instance, a room that houses computer systems arranged in a number of racks. These racks are configured to house a number of computer systems which typically include a number of printed circuit boards (PCBs), mass storage devices, power supplies, processors, micro-controllers, and semi-conductor devices, that dissipate relatively significant amounts of heat during their operation.

Multiple air conditioning units are known to be employed in cooling heated air and supplying the cooled air to the computer systems. The cooled air from the multiple air conditioning units is typically mixed together and supplied through a series of vent tiles positioned above a plenum that directs airflow from the air conditioning units to the vent tiles. Therefore, various areas of the data center receive cooled air from multiple ones of the air conditioning units. The temperatures detected at the air conditioning unit inlets are thus not an accurate reflection of the temperatures of the computer systems being cooled. However, in most instances, the temperatures at the air conditioning inlets control the air conditioning unit operations, which often lead to inefficient cool air flow provisioning.

BRIEF DESCRIPTION OF THE DRAWINGS

Features of the present invention will become apparent to those skilled in the art from the following description with reference to the figures, in which.

DETAILED DESCRIPTION

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

Disclosed herein are a computerized tool for analyzing and visualizing thermal profiles in a room and a method for implementing the computerized tool. The visualization of the thermal profiles may be employed to substantially optimize placement of equipment in a data center, to generally ensure that there are sufficient redundancies to maintain temperatures within predetermined levels should one or more of the fluid moving devices fail, to substantially ensure that the critical equipment receives cooling fluid in the event that one of the fluid moving devices fails, to determine whether any area in the room is receiving excessive amounts of cooling fluid from a plurality of fluid moving devices, etc.

Figure 1:
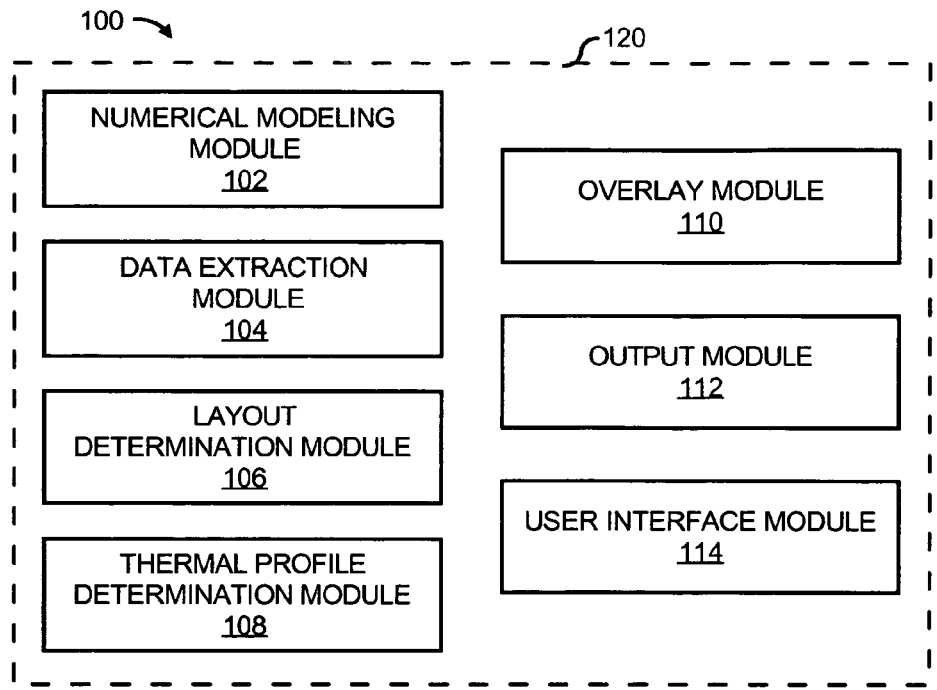
FIG. 1 shows a block diagram of a computerized tool configured to assess and visualize thermal performance in a room, according to an embodiment of the invention.

With respect to FIG. 1, there is shown a block diagram of a computerized tool 100 configured to assess and visualize a thermal profile in a room, according to an example. It should be understood that the following description of the computerized tool 100 is but one manner of a variety of different manners in which the computerized tool 100 may be configured. In addition, it should be understood that the computerized tool 100 may include additional modules and that some of the modules described herein may be removed and/or modified without departing from a scope of the computerized tool 100.

Generally speaking, the computerized tool 100 is configured to analyze a thermal profile in a room containing equipment, such as racks and electronic devices, and fluid moving devices, such as heat exchangers, air conditioning units, chiller units, etc. In analyzing the thermal profile, the computerized tool 100 is configured to compute a relatively high level metric that quantifies a phenomena within the room and to automatically overlay the relatively high level metric on a layout of the room.

According to a first example, the relatively high level metric may comprise a supply heat index (SHI), which is an index of performance that quantifies the amount of re-circulation occurring at various locations in the room. A more detailed description of SHI is presented in U.S. Pat. No. 7,051,946 to Cullen Bash et al., the disclosure of which is hereby incorporated by reference in its entirety.

As discussed in U.S. Pat. No. 7,051,946, SHI may be defined as a measure of the infiltration of heated fluid into the cooling fluid supplied by fluid moving devices 304a-304n (FIG. 3A) and may be determined for fluid flow through an object, such as a rack 306a (FIG. 3A), according to the following equation:

$$SHI = \frac{T_i - T_{ref}}{T_o - T_{ref}}. \qquad \text{Equation (1)}$$

Figure 3A:
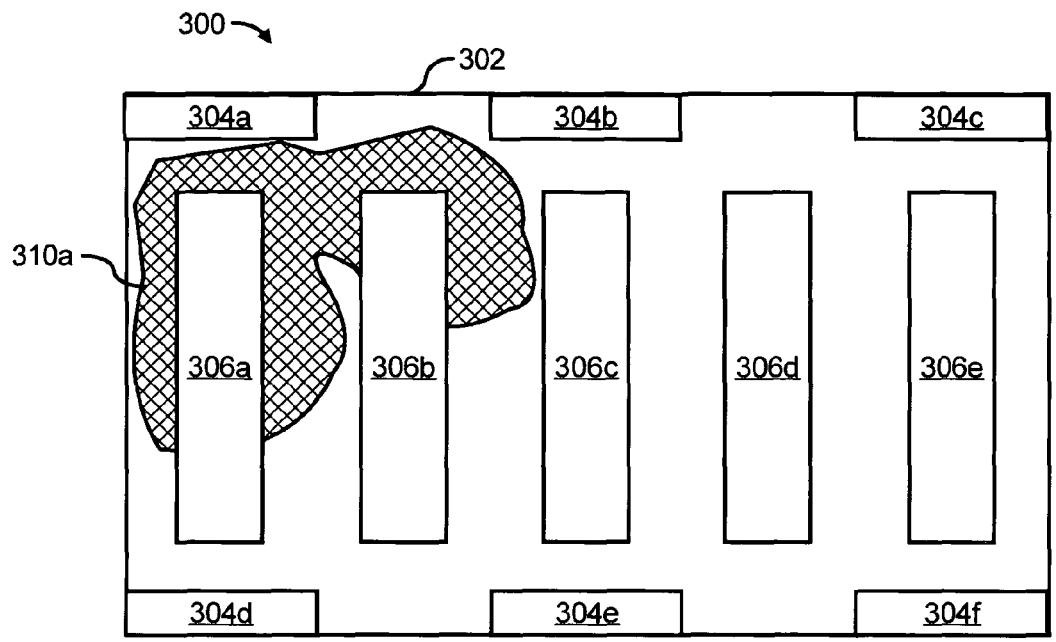
FIG. 3A illustrates an example of a room layout overlayed with a thermal profile, according to an embodiment of the invention.

In Equation (1), $T_i$ represents the temperature at an inlet of the object, $T_o$ represents the temperature at an outlet of the object, and $T_{ref}$ represents the temperature of fluid flow supplied to the inlet of the object, such as by a fluid moving device 302a (FIG. 3A). As discussed herein below, the temperatures used to determine SHI may be calculated through use of numerical modeling.

As another example of a thermal profile, the relatively high level metric may comprise a thermal correlation index (TCI), which is generally a function of the relative level of influence a fluid moving device 304a-304n has over a particular area. A more detailed description of TCI is presented in U.S. patent application Ser. No. 11/590,525, which was filed on Oct. 31, 2006, and which names George Forman et al. as the inventors, and in U.S. Pat. No. 7,117,129, filed on Mar. 11, 2005, and which names Cullen E. Bash et al. as the inventors, the disclosures of which are hereby incorporated by reference in their entireties.

As discussed in those documents, TCI is a measure of the relative level of influence a fluid moving device has over a particular area in a room. Thus, for instance, the higher the TCI value at a particular location for a fluid moving device, the greater the influence the fluid moving device has over that location. Although the TCI of a fluid moving device may be calculated through any number of suitable correlation algorithms, the following algorithm may be employed to calculate the TCI of a fluid moving device and a number of locations (i) in a room.

$$TCI_i = \frac{(T_1 - T_2)}{N}. \quad \text{Equation (2)}$$

In Equation (2), $T_1$ is a temperature measurement determined at a first fluid moving device setting and $T_2$ is a temperature measurement determined at a second fluid moving device setting. In addition, N is the amount of supply fluid condition change for the fluid moving device between the first temperature measurement and the second temperature measurement.

By way of example, if the temperature measurement recorded at the first fluid moving device setting ($T_1$) is 20° C., the temperature measurement recorded at the second fluid moving device setting ($T_2$) is 25° C., and the change in temperature of the supply fluid (N) is +10° C., the $TCI_i$ between a first location (i) and the fluid moving device is 0.5. As another example, if the temperature measurement recorded at the first fluid moving device setting ($T_1$) is 20° C., the temperature measurement recorded at the second fluid moving device setting ($T_2$) is 21° C., and the change in temperature of the supply fluid (N) is +10° C., the $TCI_i$ between a second location (i) and the fluid moving device is 0.10. As such, the first location is influenced to a greater extent by the fluid moving device than the second location. Thus, changes to the supplied fluid flow from the fluid moving device are likely to have a greater impact on conditions at the first location as compared with the second location.

As a further example of a thermal profile, the relatively high level metric may comprise a local workload placement index (LWPI), which is generally a measure of an electronic device's cooling efficiency. In other words, for example, the LWPI for a particular electronic device may be defined as the amount of energy that electronic device requires to be maintained within a predetermined temperature range. A more detailed description of LWPI is presented in the 11/590,525 application for patent, the entire disclosure of which is hereby incorporated by reference in its entirety.

As discussed in that application for patent, the LWPI may be determined through a function in which the LWPI increases with an increase in one or both of the thermal management margin and the fluid moving device margin and a decrease in the recirculation level. In addition, the LWPI's for each of a plurality of electronic devices (i) may be calculated through a function of one or more of $(T_{set}-T_{in})_i$, $(T_{SAT}-T_{SAT,min})_j$, $TCI_j$, and $(T_{in}-T_{SAT})_j$, where $T_{set}$ is a setpoint temperature of a fluid moving device 302a (FIG. 3A), $T_{in}$ is the inlet temperature of the electronic device (i), $T_{SAT}$ is the supply fluid temperature, and $T_{SAT,min}$ is the minimum supply fluid temperature.

By way of particular example and not of limitation, the cooling efficiency or workload placement efficiency (LWPI) of a particular electronic device (i) may be calculated from the following equation:

$$LWPI_i = \frac{(T_{set} - T_{in})_i + \left[(T_{SAT} - T_{SAT,min})_j \cdot TCI_j\right]_i}{(T_{in} - T_{SAT})_i}. \quad \text{Equation (3)}$$

According to an example, the computerized tool 100 may visually display the relationships between the thermal profile and the layout for a given room. The visual display of these relationships may be created in a two-dimensional or a three-dimensional setting and may be provided at various heights with respect to the room. The visual display may be used, for instance, to optimize the placement of equipment in a data center, to investigate cooling system failure scenarios, to insure proper cooling redundancies are in place, etc.

As shown in FIG. 1, the computerized tool 100 includes a number of modules 102-114, each configured to perform one or more functions. The modules 102-114 may comprise software configured to be invoked or implemented by a computing device, hardware components configured to perform the one or more functions, or combinations thereof. By way of example, one or more of the modules 102-114 may comprise computer chips configured and programmed to perform the functions described below.

In one of the examples discussed above, the computerized tool 100 comprises software or other algorithms stored on a storage device 120. The storage device 120 may comprise, for instance, volatile or non-volatile memory, such as DRAM, EEPROM, MRAM, flash memory, and the like. In addition, or alternatively, the computerized tool 100 may be stored on a removable media, such as, a floppy disk, a CD-ROM, a DVD-ROM, or other optical or magnetic media. In this example, one or more of the modules 102-114 may be stored as software on the storage device 120.

In another of the examples discussed above, the computerized tool 100 comprises a hardware device, such as, a computing device. In this example, the computerized tool 100 may comprise a personal computer, a laptop computer, a portable digital assistant, or other type of device capable of performing computing functions. In addition, one or more of the modules 102-114 may comprise hardware components configured to perform the one or more functions. In addition, or alternatively, one or more of the modules 102-114 may comprise software stored on the hardware components.

In addition, the computerized tool 100 may be located remotely and may be accessed and implemented over a network, such as, an intranet, the Internet, etc.

Figure 2:
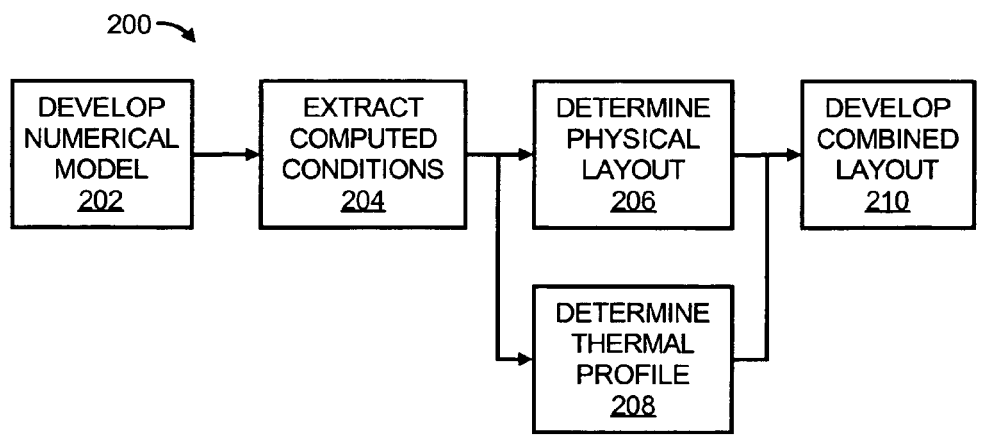
FIG. 2 shows a flow diagram of a method for assessing a thermal profile with respect to equipment housed in a room, according to an embodiment of the invention.

The operations performed by the modules 102-114 will be described in accordance with both of these examples and with regard to the flow diagram depicted in FIG. 2. FIG. 2, more particularly, depicts a flow diagram of a method 200 for analyzing a thermal profile with respect to equipment housed in a room, according to an example. It should be understood that the following description of the method 200 is but one manner of a variety of different manners in which such a method 200 may be implemented. In addition, it should be understood that the method 200 may include additional steps and that some of the steps described herein may be removed and/or modified without departing from a scope of the method 200.

At step 202, a numerical model of environmental conditions in the room may be developed. The numerical model may be developed based upon information pertaining to the room, such as, the room layout, the equipment housed in the room, the locations and output profiles of fluid moving devices, as well as other objects or obstructions in the room. In one example, the numerical modeling module 102 may comprise software or algorithms configured to develop the numerical model. In this example, the room information may be input into the numerical modeling module 102 and the numerical modeling module 102 may compute the environmental conditions in the room based upon the inputted information.

In another example, the numerical modeling module 102 may be configured to interface with an outside numerical modeling program configured to develop the numerical model. An example of a suitable numerical modeling program is a computational fluid dynamics program, such as, FLOVENT, available from Flomerics Inc., located in Marlborough, Mass. In this example, the numerical modeling module 102 may be configured to provide the outside numerical modeling program with the room information and to receive the numerical model computed by the outside numerical modeling program.

In either example, the environmental conditions may include, for instance, pressure levels, temperature levels, fluid flow velocity levels, humidity levels, etc., at various locations or throughout the room. The environmental conditions may also be calculated in two or three dimensions with respect to the room.

At step 204, the data extraction module 104 may extract some or all of the environmental conditions computed from the numerical model developed at step 202. In various examples, the data extraction module 104 may form part of the numerical modeling module 102 and may thus be configured to model the conditions at step 202. In any regard, the layout determination module 106 may employ the environmental condition information to calculate a layout of the room, as indicated at step 206. For instance, from the environmental condition information, the layout determination module 106 may determine locations in the room having predetermined environmental condition levels and may determine that one or more objects exist at those locations. For instance, the layout determination module 106 may consider those locations in the room having zero or nearly zero environmental condition levels, such as, pressure, humidity, etc., as including one or more objects.

By way of particular example, the environmental condition extracted from the numerical model may comprise the pressure level distribution in the room. In this example, for instance, the layout determination module 106 may determine the pressure level distribution at a height in the room where objects, such as racks, fluid moving devices, etc., are known to be located. The layout determination module 106 may analyze the pressure level distribution at that selected height to find areas of zero or nearly zero pressure, which are considered to correlate with the locations of the objects. The layout determination module 106 may plot the calculated locations of the objects in a chart to thereby depict the layout of the room. Various manners in which the room layout may be constructed from the environmental condition distribution calculation are described in greater detail herein below.

Another of the conditions extracted may comprise the temperature level distribution, which the thermal profile determination module 108 employs in determining a thermal profile of the room, as indicated at step 208. The thermal profile determination module 108 may, more particularly, use the temperatures at various heights in the room resulting from incremental changes in the cooling fluid supplied by the fluid moving devices to determine one or more thermal profiles in the room. In one example, the thermal profile determination module 108 may calculate the TCI of each of the fluid moving devices with respect to various areas in the room based upon the temperatures. In another example, the thermal profile determination module 108 may calculate the SHI at various locations in the room based upon the temperatures. Again, various manners in which the thermal profile determination module 108 operates to determine the thermal profile in a room are discussed in greater detail herein below.

At step 210, the overlay module 110 may overlay one or more of the thermal profiles on the physical layout of the room determined at step 106 to develop a combined layout. At steps 206 and 208, the room layout and the thermal profiles may be developed to have the same scale. As such, the thermal profiles may be scaled appropriately with the room layout.

Although the thermal profile determined at step 208 has been described as being overlayed on the physical layout of the room determined at step 206, it should be understood that in various instances, the thermal profile may be overlayed on other differently obtained room layouts without departing from a scope of the method 200. In other words, the thermal profile may be overlayed on a graphical representation of an existing room layout, that is, a room layout that has not been determined as indicated at step 206. However, in various other instances, it may be desirable to determine the physical layout of the room at step 206 and to overlay the thermal profile on the determined physical layout because they may have the same scaling, which may reduce the amount of time a effort required of users in visualizing the thermal profile with respect to the room layout.

In any regard, the output module 112 may store the combined layout in a database. In addition, or alternatively, the output module 112 may display or print the combined layout to thus provide users with a two or three dimensional image of the thermal profiles associated with one or more fluid moving devices in relation to room layout.

The user interface module 114 may provide users with the ability to modify or manipulate the inputs into the numerical modeling module 102 or to the outputs generated by the output module 112. In one example, users may implement the user interface module 114 to determine the thermal profile resulting from various fluid moving device placements, various fluid moving device failures, various rack placements, etc. In another example, the user interface module 114 may provide users with the ability to modify the combined layout visualization in various respects.

Figure 3B:
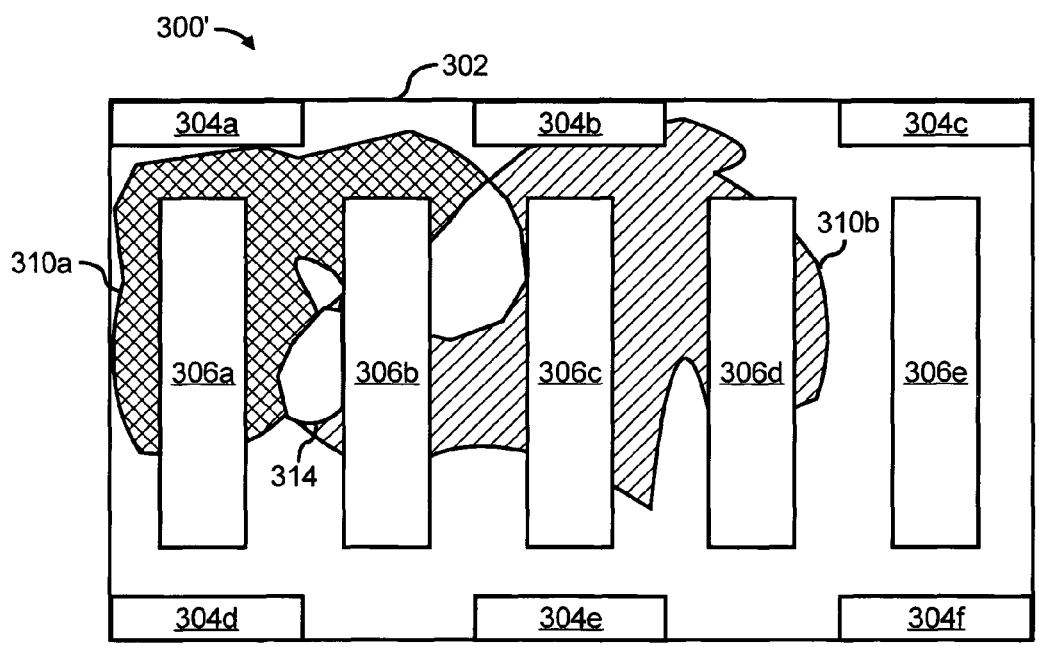
FIG. 3B illustrates an example of a room layout overlayed with multiple thermal profiles, according to an embodiment of the invention.

An example of a combined layout 300, 300' developed by the computerized tool 100 is depicted in FIGS. 3A and 3B. More particularly, FIGS. 3A and 3B respectively show examples of how thermal profiles 310a-310n may be depicted in a room 302 containing fluid moving devices 304a-304n and racks 306a-306n, where "n" is an integer equal to or greater than one. Only two thermal profiles 310a and 310b, six fluid moving devices 304a-304f, and six racks 306a-306f are depicted in FIGS. 3A and 3B for illustrative purposes and should thus not be construed as limiting the combined layout 300, 300' output in any respect. Although not shown, the combined layouts 300, 300' may also include labels that identify the various objects contained therein.

With reference first to the combined layout 300 in FIG. 3A, only the thermal profile 310a, such as, the thermal correlation index (TCI), associated with one of the fluid moving devices 304a is shown therein. One purpose of the combined layout 300 in FIG. 3A is to clearly show the level of influence over particular areas, as denoted by TCI, of the fluid moving device 304a. Similar types of figures may be prepared for each of the remaining fluid moving devices 304b-304f to depict their relative levels of influence over particular areas in the room 302.

In addition, the thermal profiles 310a-310n associated with two or more of the fluid moving devices 304a-304f may also be depicted together, as shown in FIG. 3B. The combined layout 300' in FIG. 3B more particularly shows that there may be areas of overlap 314 among two or more TCIs 310a-310n. As such, the combined layout 300' may display which of the fluid moving devices 304a-304n provide cooling fluid to which areas in the room 302. This information may be employed to ensure that there are sufficient redundancies to maintain temperatures within predetermined levels should one or more of the fluid moving devices 304a-304n fail. In one example, critical equipment may be placed in areas of overlap 314 to substantially ensure that the critical equipment receives cooling fluid in the event that one of the fluid moving devices 304a-304n fails. This information may also be employed to determine whether any area in the room 302 is receiving excessive amounts of cooling fluid from a plurality of fluid moving devices 304a-304n and may thus be used to determine optimal placement of the fluid moving devices 304a-304n.

As shown in FIGS. 3A and 3B, the combined layouts 300, 300' may be configured to display TCI 310a-310n levels that exceed a predetermined threshold level. Thus, even though the fluid moving device 304a may have influence over areas other than the TCI 310a, only the TCI 310a exceeding the predetermined threshold level is depicted in the combined layouts 300, 300' to thereby provide users with the ability to control the data displayed in the combined layouts 300, 300'. In addition, or alternatively, the combined layouts 300, 300' may display varying levels of TCI for each of the fluid moving devices 304a-304n. Thus, for instance, the TCIs 310a-310n may comprise different colors or different shadings of colors that substantially correspond to different TCI levels.

Figure 4:
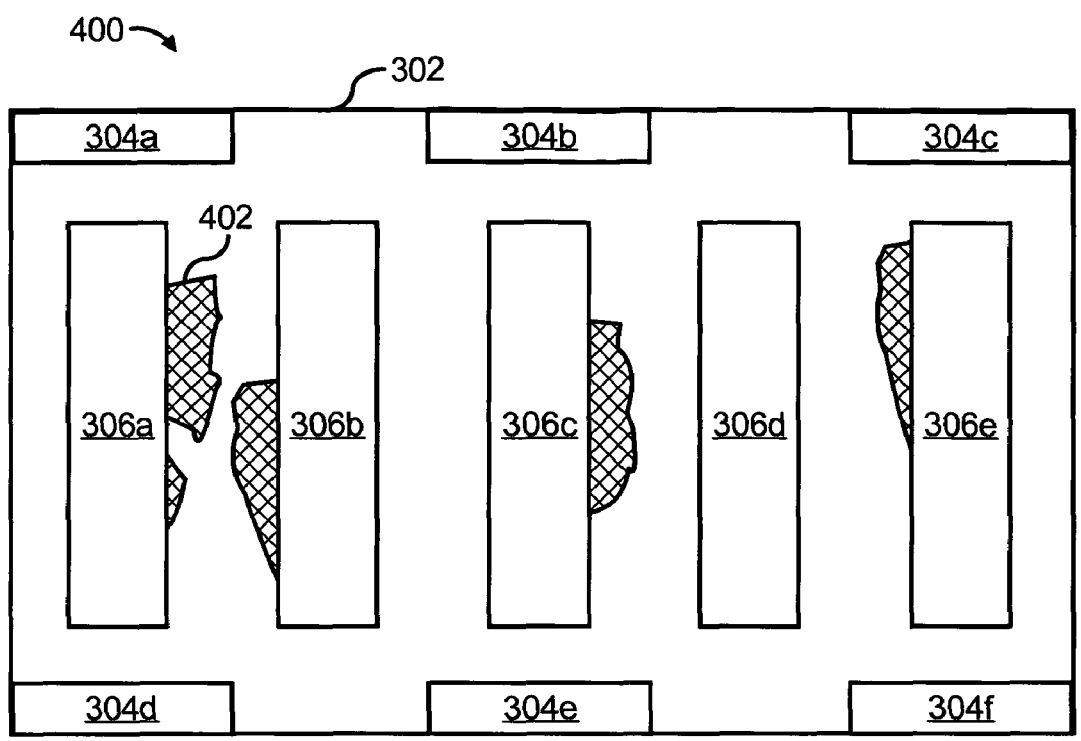
FIG. 4 illustrates an example of a room layout overlayed with a thermal profile, according to another embodiment of the invention.

Another example of a combined layout 400 developed by the computerized tool 100 is depicted in FIG. 4. FIG. 4 depicts all of the same features as FIGS. 3A and 3B, including the room 302, the fluid moving devices 304a-304n, and the racks 306a-306n. The combined layout 400 in FIG. 4 differs from the combined layouts 300 and 300' because it displays a different type of thermal profile 402. In the combined layout 400, the computerized tool 100 is configured to depict thermal profiles, such as, SHI and LWPI levels throughout the room 300.

The combined layout 400 may be configured to display SHI or LWPI 402 levels that exceed a predetermined threshold level. Thus, for instance, even though there may be an appreciable amount of SHI in areas other than those illustrated in the layout 400, those areas are not illustrated because they do not exceed the predetermined threshold level. In addition, or alternatively, the combined layout 400 may display varying levels of SHI or LWPI 402 by displaying the varying levels using different colors or different shadings of colors that substantially correspond to different SHI or LWPI levels.

With reference now to FIGS. 5A-5E, there is collectively shown a flow diagram of a method 500 for analyzing and visualizing a thermal profile of a room, such as, the room 302 depicted in FIGS. 3A, 3B, and 4. It should be apparent to those of ordinary skill in the art that the method 500 represents a generalized illustration and that other steps may be added or existing steps may be removed, modified or rearranged without departing from a scope of the method 500.

The description of the method 500 is made with reference to the computerized tool 100 illustrated in FIG. 1, and thus makes reference to the elements cited therein. It should, however, be understood that the method 500 is not limited to the elements set forth in the computerized tool 100. Instead, it should be understood that the method 100 may be practiced by a computerized tool having a different configuration than that set forth in FIG. 1. In addition, the method 500 includes some of the steps outlined in the method 200 depicted in FIG. 2. The method 500 differs from the method 200 in that the steps contained in the method 500 describe, in greater detail, the steps contained in the method 200. For instance, FIGS. 5A and 5B include steps for developing a numerical model (step 202) and for extracting computed conditions (step 204), FIGS. 5C and 5D include steps for determining the physical layout (step 206) and the thermal profile (step 208) of the room 302, and FIG. 5E includes steps for developing the combined layout (step 210), as well as steps for displaying the combined layout.

Figure 5A:
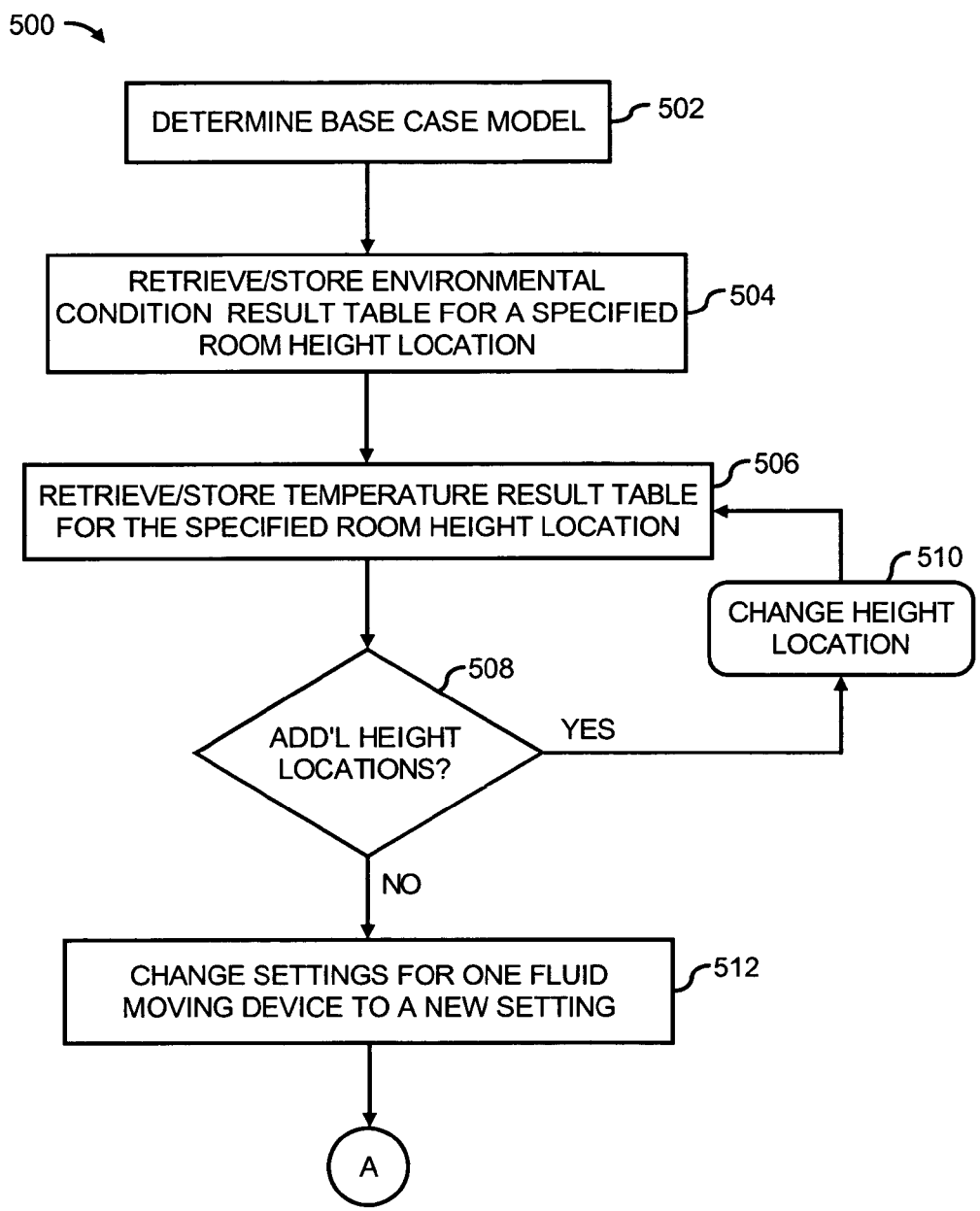
FIGS. 5A-5E, collectively, show a flow diagram of a method for analyzing and visualizing a thermal profile of a room, according to an embodiment of the invention.
Figure 5B:
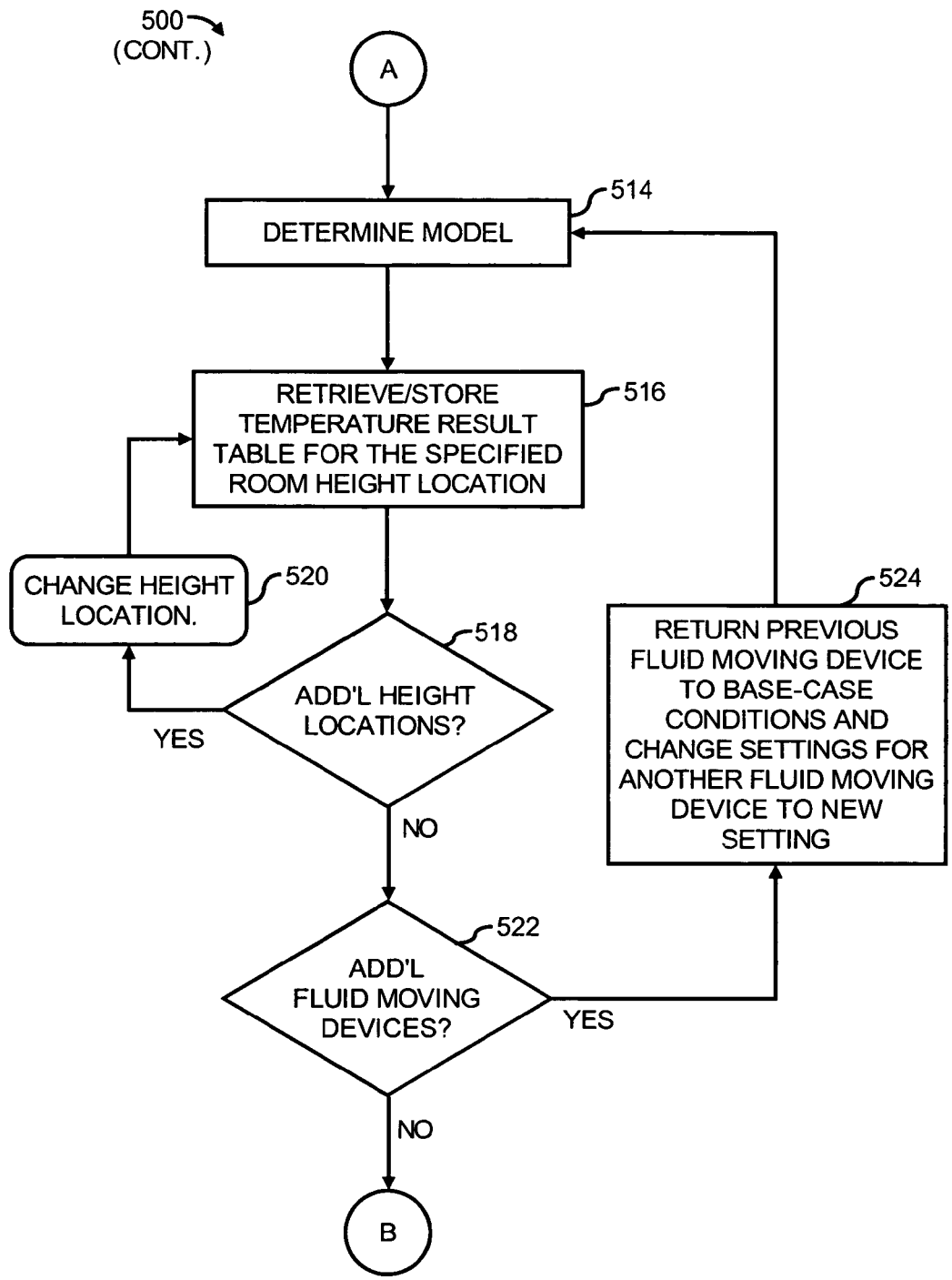

With reference first to FIGS. 5A and 5B, at step 502, the computerized tool 100 may determine a base case model of conditions in the room 302 for a given set of settings for the fluid moving devices 304a-304n. Alternatively, the computerized tool 100 may invoke an outside numerical modeling program, such as FLOVENT, to run the base case model. In either case, by way of example, the fluid moving devices 304a-304n may be set to an initial setting in the numerical modeling program in determining the base case model. The initial setting may comprise, for instance, 70% fluid flow capacity and 72° F. supply temperature.

The base case model generally provides information pertaining to the environmental condition levels calculated at a specified height in the room 302 as well as the temperatures calculated at the specified height. The specified height may be selected to substantially ensure that substantially all of the objects, such as, fluid moving devices 304a-304n, racks 306a-306n, etc., contained in the room 302 are located at the specified height. The information may be stored in an environmental condition result table and a temperature result table for the specified height. At step 504, the computerized tool 100 may store the environmental condition result table for the specified height. Alternatively, the computerized tool 100 may retrieve and store the environmental condition result table for the specified height from the outside numerical modeling program.

As described in greater detail herein below, the information contained in the environmental condition result table may be employed to calculate a physical layout of the room 302.

At step 506, the computerized tool 100 may store the temperature result table for the specified height. Alternatively, the computerized tool 100 may retrieve and store the temperature result table for the specified height from the outside numerical modeling program. In either case, the computerized tool 100 may save the temperature result table as a "csv" file.

At step 508, a determination as to whether a temperature result table for a height different than the specified room height is to be retrieved/stored may be made. A decision to retrieve/store the temperature result table for an additional height location may be made in situations where the temperatures at additional heights in the room are desired or necessary. If a determination is made to retrieve/store the temperature result table at the additional height location, the computerized tool 100 may change the height location as indicated at step 510. The computerized tool 100 may additionally retrieve/store the temperature result table for the additional height, as indicated at step 506. Steps 506-510 may be repeated for any additional height locations as desired or as is necessary.

Following a "no" condition at step 508, the computerized tool 100 may change the settings for one of the fluid moving devices 304a to a different setting, as indicated at step 512. By way of example, the fluid moving device 304a may be set to 100% fluid flow capacity and 60° F. supply temperature. In addition, at step 514 (FIG. 5B), the numerical modeling module 102 may determine a model of conditions in the room 302 resulting from the new fluid moving device 304a setting. Alternatively, the computerized tool 100 may invoke an outside numerical modeling program to determine the model at the new fluid moving device 304a setting.

At step 516, the computerized tool 100 may store the temperature result table for a specified height. Alternatively, the computerized tool 100 may retrieve and store the temperature result table for a specified height from the outside numerical modeling program. In either case, the computerized tool 100 may save the temperature result table as a "csv" file. In addition, similarly to steps 506-510 (FIG. 5A), the temperature result table at additional height locations may be retrieved/stored, as indicated at steps 516-520. Moreover Steps 516-520 may be repeated for any additional height locations as desired or as is necessary.

Following a "no" condition at step 518, a determination as to whether the temperature results for additional fluid moving devices 304b-304n are to be determined may be made at step 522. An election to obtain temperature results for additional fluid moving devices may be made, for instance, if it is determined that conditions at various settings for each of remaining fluid moving devices 304b-304n has not been determined. In response to a "yes" condition at step 522, the computerized tool 100 may return the settings for the fluid moving device 304a back to the initial setting (step 502) and may change the settings for another one of the fluid moving devices 304b to a different setting, as indicated at step 524. By way of example, the fluid moving device 304b may be set to 100% fluid flow capacity and 60° F. supply temperature. In addition, steps 514-522 may be repeated for the remaining fluid moving devices 304b-304n.

As described in greater detail herein below, the information contained in the temperature results tables and the various fluid moving device 304a-304n settings may be used to calculate various thermal profiles in the room 302. This information may, for instance, be used to calculate SHIs at various locations throughout the room 302 through implementation of Equation (1). In addition, or alternatively, the collected temperature information may be used to calculate the TCIs between the fluid moving devices 304a-304n and various locations throughout the room 302 through implementation of Equation (2). Moreover, the collected temperature information may be used to calculate the LWPIs of one or more electronic devices through implementation of Equation (3).

Figure 5C:
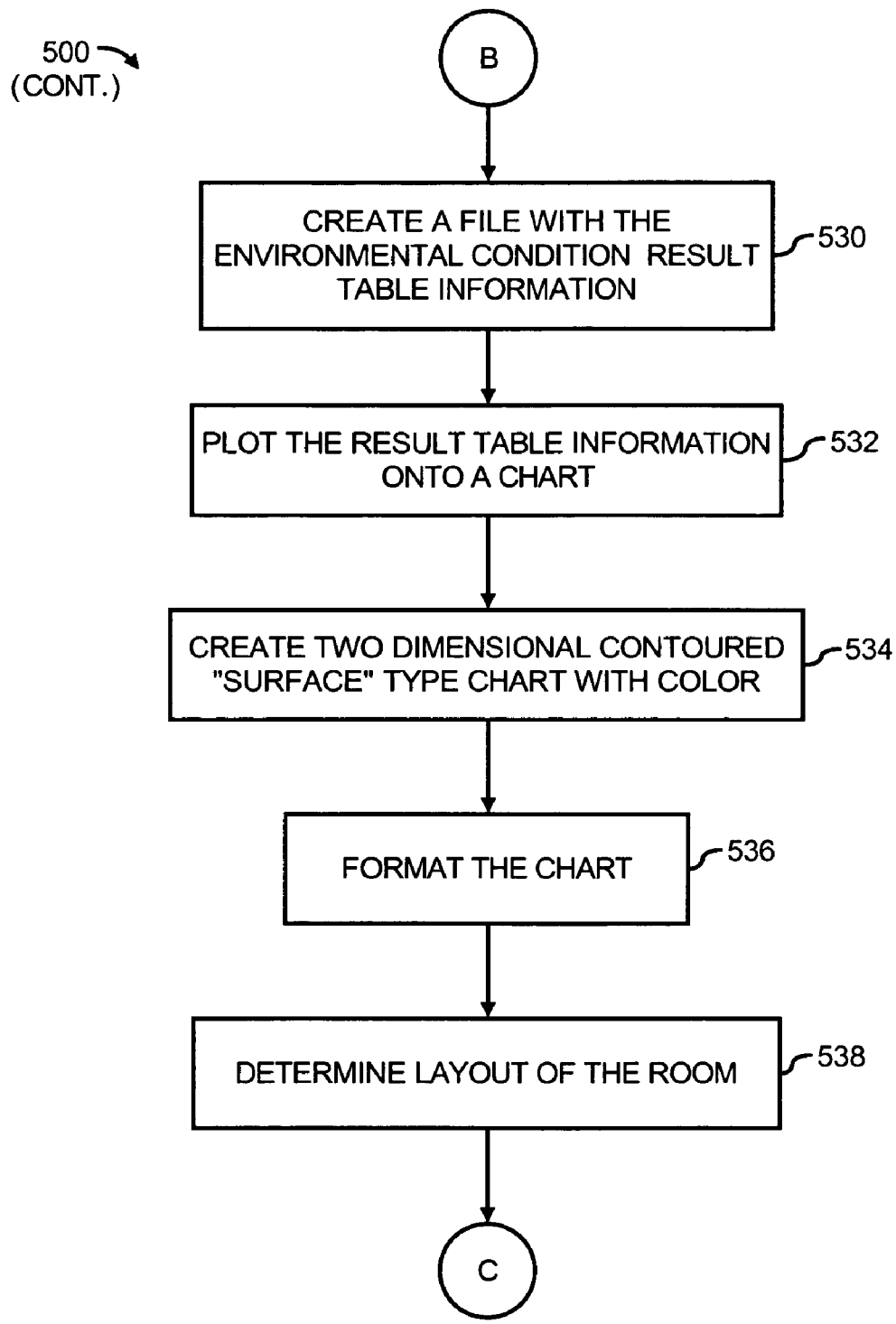

With reference now to FIG. 5C, there are shown steps for determining the physical layout of the room 302 (step 206) from the information obtained from the steps outlined in FIGS. 5A and 5B. More particularly, at step 530 the computerized tool 100 may utilize the information contained in the environmental condition result table stored at step 504 (FIG. 5A) to create a file, such as a spreadsheet file with the environmental condition information. According to an example, the computerized tool 100 may communicate with a spreadsheet program, such as, MS EXCEL, available from Microsoft Corporation of Redmond, Seattle. In this example, the computerized tool 100 may store the environmental condition result table information in the spreadsheet program.

In any regard, the computerized tool 100 or the spreadsheet program may plot the environmental condition result table information onto a chart, as indicated at step 532. In situations where the spreadsheet program is implemented, the computerized tool 100 may select the environmental condition data contained in the spreadsheet and may invoke or otherwise activate a chart creating program, such as a chart wizard, to create the chart.

According to an example, the chart may comprise a "surface" type of chart having a two dimensional contour and having color, as indicated at step 534. At step 536, the chart may be formatted to, for instance, remove tick marks and a legend box on the chart to therefore obtain a similar layout to that of the room 302 depicted in FIG. 3A. More particularly, the chart may have a fairly rough outline of the room 302 exterior along with outlines of the fluid moving devices 304a-304f and the racks 306a-306e. In one regard, the fluid moving devices 304a-304f and the racks 306a-306e would be distinguishable in the chart because those locations have been computed to have zero or very nearly zero condition level. As such, the computerized tool 100 may implement the chart to determine the layout of the room 302, as indicated at step 538.

Figure 5D:
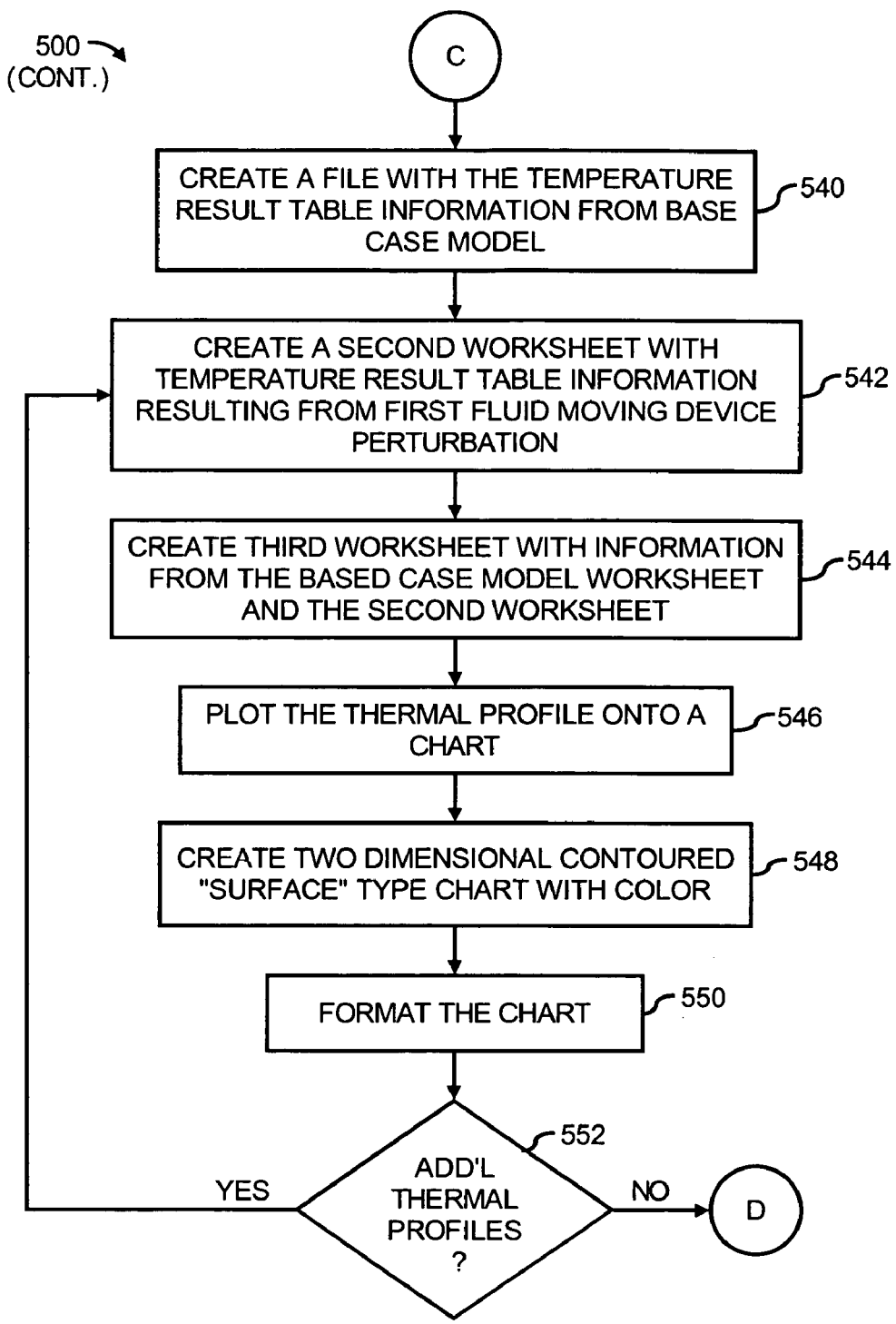

With reference now to FIG. 5D, there are shown steps for determining the thermal profile in the room 302 (step 208) from the information obtained from the steps outlined in FIGS. 5A and 5B. More particularly, at step 540, the computerized tool 100 may utilize the information contained in the temperature results tables stored at step 506 (FIG. 5A) from the base case model determined at step 502 (FIG. 5A) and at the various heights (step 510) to create a file, such as a spreadsheet file with the temperature information. According to an example, the data extraction module 104 may communicate with a spreadsheet program, such as, MS EXCEL, available from Microsoft Corporation of Redmond, Seattle. In this example, the data extraction module 104 may store the temperature result table information in the spreadsheet program.

At step 542, a second worksheet containing information from the temperature result table stored at step 516 (FIG. 5B) and at the various heights (step 520) resulting from a first fluid moving device 304a perturbation at step 512 (FIG. 5A) may be created. The second worksheet may be saved with a name that distinguishes the worksheet from other worksheets, for instance, the worksheet name may be derived from the first perturbed fluid moving device 304a.

At step 544, a third worksheet may be created and information from the worksheet containing the temperature information from the base case model and information from the second worksheet may be inserted into the third worksheet. The third worksheet may include, for instance, the temperature information from the base case model in one column, the temperature information from the second worksheet in another column, the difference in temperature between the base case model and the modified temperature at step 512 in a third column, and a thermal profile calculation based upon the information contained in the first three columns in a fourth column.

Thus, for instance, the fourth column in the third worksheet may include a TCI calculation (Equation (2)) for the first fluid moving device 504a. More particularly, for each row in the third column, the temperature information from the second column may be subtracted from the temperature information from the first column, and the difference may be divided by the difference in temperature between the base case model and the temperature set for the first moving device 504a at step 512 in the third column. A fifth column may include information, for instance, in a two or three dimensional coordinate system, of the locations at which the temperatures were modeled.

At step 546, the computerized tool 100 or the spreadsheet program may plot the thermal profile information from the fourth column and the fifth column onto a chart to thereby depict the TCI information for various areas in the room 302. In situations where the spreadsheet program is implemented, the computerized tool 100 may select the thermal profile information contained in the spreadsheet and may invoke or otherwise activate a chart creating program, such as a chart wizard, to create the chart.

According to an example, the chart may comprise a "surface" type of chart having a two dimensional contour and having color, as indicated at step 548. At step 550, the chart may be formatted to, for instance, remove tick marks and a legend box on the chart to therefore obtain the thermal profile 310a depicted in FIG. 3A, without the room 302 layout.

In addition, or alternatively, the third worksheet may include additional information with respect to the temperatures obtained in FIGS. 5A-5C. The additional information may include the temperatures at various inlets and outlets of the racks 306a-306e at various fluid moving device 304a-304f temperatures. In this regard, one column in the third worksheet may include the inlet temperatures, a second column may include the outlet temperatures, and a third column may include the temperatures of the fluid supplied by the fluid supply devices 304a-304n, which may be considered as reference temperatures. In this example, a fourth column may include a SHI calculation (Equation (1)) for various locations in the room 302. More particularly, for each row of the third worksheet, the fourth column may include an equation to calculate the SHI information in the room. A fifth column may include information, for instance, in a two or three dimensional coordinate system, of the locations at which the inlet, outlet, and reference temperatures were modeled. In addition, steps 546-550 may be performed to chart the SHI values in the room 302 as depicted in FIG. 4.

In any case, at step 552, a determination as to whether thermal profiles for additional fluid moving devices 304b-304f are to be charted may be made. An election to chart thermal profiles for additional fluid moving devices 304b-304f may be made, for instance, if it is determined that the thermal profiles associated with each of the fluid moving devices 304b-304f have not been previously charted. In response to a "yes" condition at step 552, steps 542-552 may be respectively repeated for the remaining fluid moving devices 304b-304f to thereby chart the thermal profiles 310a-310n of the fluid moving devices 304b-304f. In addition, the thermal profiles 310a-310n of the fluid moving devices 304a-304f may be stored as respective worksheets.

Figure 5E:
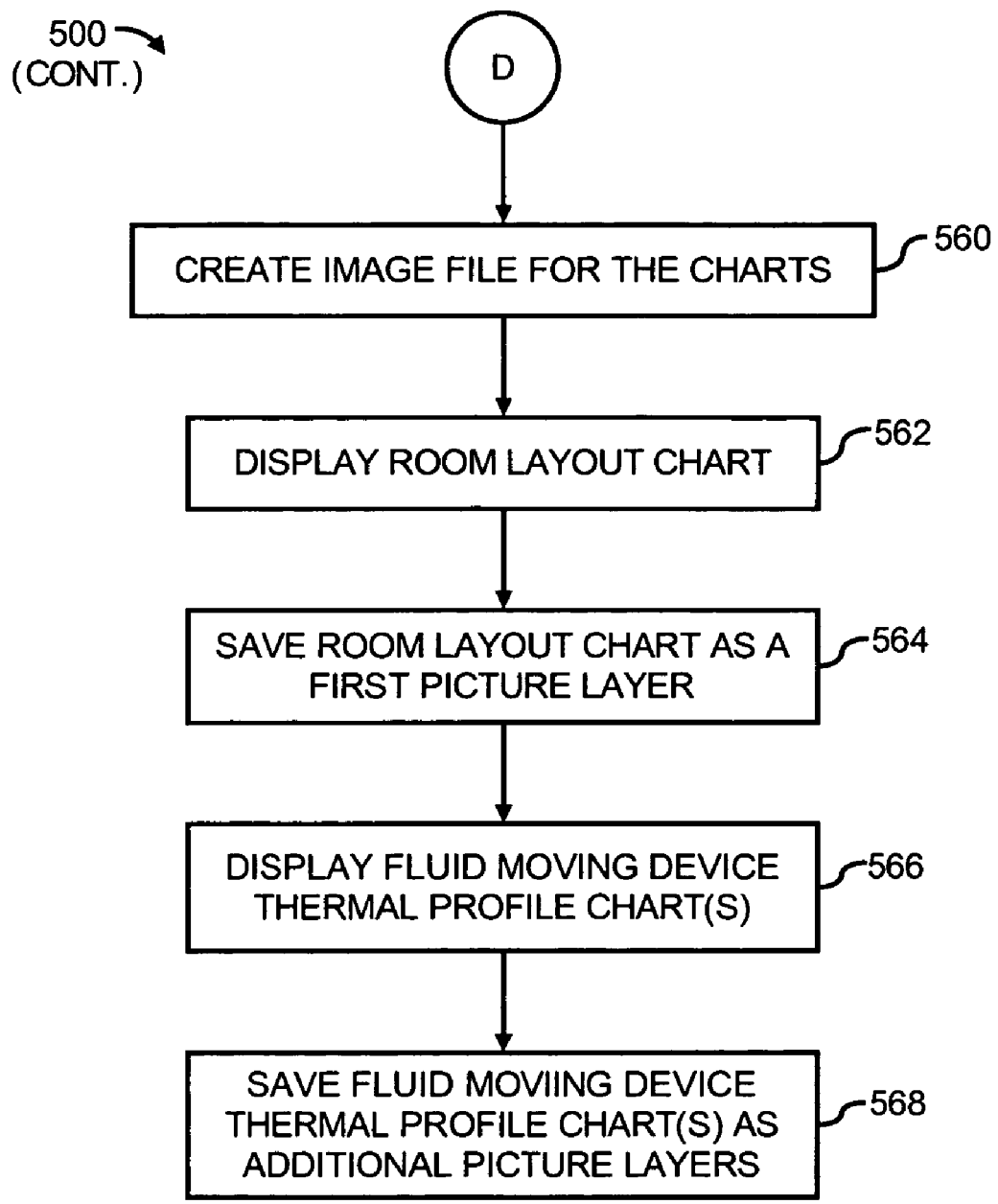

In response to a "no" condition at step 552, the computerized tool 100 may create an editable image file with the charts created in FIGS. 5A-5C, as indicated at step 560 (FIG. 5E). More particularly, for instance, the computerized tool 100 may import or export the charts into a file where the charts may be manipulated. According to an example, the computerized tool 100 may export the charts into an image editing program, such as, ADOBE PHOTOSHOP, available from Adobe Systems Incorporated of San Jose, Calif.

In any regard, at step 562, the computerized tool 100 or the image editing program may display the chart depicting the room layout created at steps 532-538. The room layout chart may be manipulated in various respects to refine the display of the room layout. The room layout chart may be refined to, for instance, more clearly delineate the locations of the fluid moving devices 304a-304f and the racks 306a-306e from the remaining areas of the room 302. The room layout chart may also be refined by including labels for each of the components depicted in the room layout 302. In addition, the refined room layout may be saved as a first picture layer as indicated at step 564.

At step 566, the chart depicting the thermal profile of a first fluid moving device 304a created at steps 540-550 may be displayed over the first picture layer including the room layout as a second picture layer. The thermal profile depicted in the second picture layer may be refined at step 566 or during the plotting of the thermal profile to depict thermal profiles that exceed a predetermined minimum value. In this regard, extraneous thermal profile values may be omitted from the display.

The overlay of the second picture layer on the first picture layer may result in an image similar to the combined layout 300 depicted in FIG. 3A or the combined layout 400 depicted in FIG. 4 depending on the thermal profile being displayed. In addition, at step 566, the chart depicting the thermal profile of a second fluid moving device 304b created at steps 540-550 may also be displayed over the first and/or second picture layers as a third picture layer. The overlay of the third picture layer may result in an image similar to the combined layout 300' depicted in FIG. 3B. The charts depicting the thermal profiles of the remaining fluid moving devices 304c-304f may also be respectively overlayed as additional picture layers to thereby enable the thermal profiles of the fluid moving devices 304a-304f to be displayed individually or in combination with each other.

At step 568, the thermal profile charts of the fluid moving devices 304a-304f may be stored as additional picture layers. As such, users may access the thermal profile charts to determine, for instance, the areas of influence for each of the fluid moving devices 304a-304f and may also manipulate the data as desired.

The picture layers containing the room layout 302 and the thermal profiles 310a-310n of the fluid moving devices 304a-304n may be stored according to the heights at which the thermal profiles 310a-310n were determined. As such, for instance, a number of files pertaining to thermal profiles 310a-310n determined at the various heights may be created and stored to thereby enable analysis and visualization of thermal profiles 310a-310n at different heights in the room 302.

According to another example, a three-dimensional layout of the room 302 and thermal profiles 310a-310n associated with the fluid moving devices 304a-304n may be created. In this example, the environmental condition result tables for a number of room height locations may be retrieved and/or stored at step 504. The information contained in the environmental condition result tables at the various heights may be plotted together at step 532 to create a three-dimensional layout of the room 302. In addition, at step 534, a three dimensional chart may be created. The thermal profiles of the fluid moving devices 304a-304n may also be plotted in three dimensions at step 546 and a three-dimensional chart may be created at step 548.

The operations set forth in the methods 200 and 500 may be contained as a utility, program, or subprogram, in any desired computer accessible medium. In addition, the methods 200 and 500 may be embodied by a computer program, which can exist in a variety of forms both active and inactive. For example, it can exist as software program(s) comprised of program instructions in source code, object code, executable code or other formats. Any of the above can be embodied on a computer readable medium, which include storage devices and signals, in compressed or uncompressed form.

Exemplary computer readable storage devices include conventional computer system RAM, ROM, EPROM, EEPROM, and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that any electronic device capable of executing the above-described functions may perform those functions enumerated above.

Figure 6:
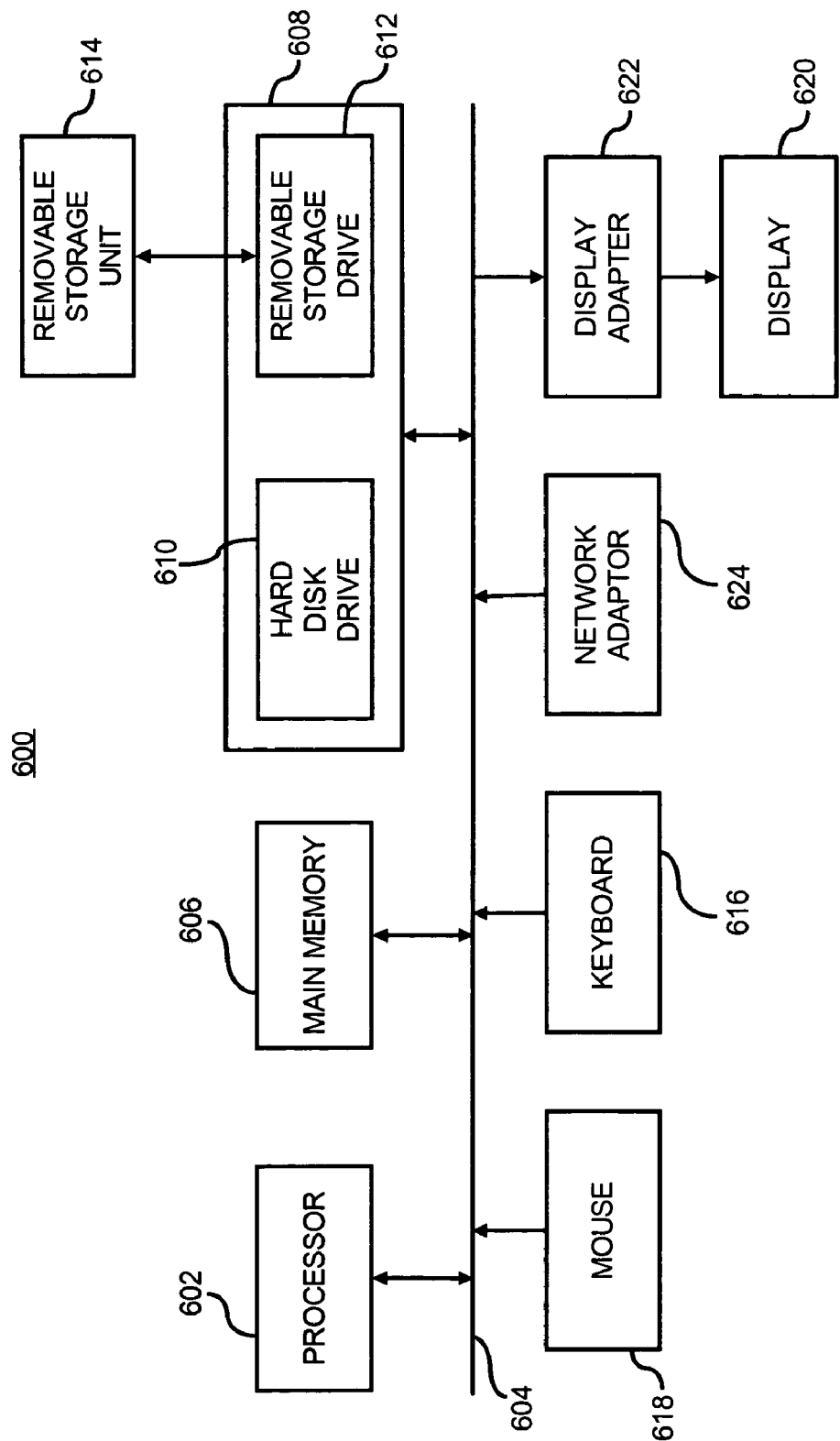
FIG. 6 illustrates a computer system, which may be employed to implement the computerized tool depicted in FIG. 1, according to an embodiment of the invention.

FIG. 6 illustrates a computer system 600, which may be employed to perform the various functions of the computerized tool 100 described hereinabove, according to an embodiment. In this respect, the computer system 600 may be used as a platform for executing one or more of the functions described hereinabove with respect to the computerized tool 100.

The computer system 600 includes one or more controllers, such as a processor 602. The processor 602 may be used to execute some or all of the steps described in the methods 200 and 500. Commands and data from the processor 602 are communicated over a communication bus 604. The computer system 600 also includes a main memory 606, such as a random access memory (RAM), where the program code for, for instance, the computerized tool 100, may be executed during runtime, and a secondary memory 608. The secondary memory 608 includes, for example, one or more hard disk drives 610 and/or a removable storage drive 612, representing a floppy diskette drive, a magnetic tape drive, a compact disk drive, etc., where a copy of the program code for the sensor commissioning system may be stored.

The removable storage drive 610 reads from and/or writes to a removable storage unit 614 in a well-known manner. User input and output devices may include a keyboard 616, a mouse 618, and a display 620. A display adaptor 622 may interface with the communication bus 604 and the display 620 and may receive display data from the processor 602 and convert the display data into display commands for the display 620. In addition, the processor 602 may communicate over a network, for instance, the Internet, LAN, etc., through a network adaptor 624.

It will be apparent to one of ordinary skill in the art that other known electronic components may be added or substituted in the computer system 600. In addition, the computer system 600 may include a system board or blade used in a rack in a data center, a conventional "white box" server or computing device, etc. Also, one or more of the components in FIG. 6 may be optional (for instance, user input devices, secondary memory, etc.).

What has been described and illustrated herein is a preferred embodiment of the invention along with some of its variations. The terms, descriptions and figures used herein are set forth by way of illustration only and are not meant as limitations. Those skilled in the art will recognize that many variations are possible within the scope of the invention, which is intended to be defined by the following claims—and their equivalents—in which all terms are meant in their broadest reasonable sense unless otherwise indicated.

What is claimed is:

1. A computerized tool for assessing conditions in a room, said computerized tool comprising:
  a memory storing,
    a data extraction module for at least one of modeling and extracting environmental condition data of a room; and
    a layout module for determining one or more areas in the room having pressure values that are equal to zero, wherein said layout module is further to determine a layout of physical locations of one or more objects in the room based upon the determination of the one or more areas having pressure values that are equal to zero; and
  a processor to execute the data extraction module and the layout module.

2. The computerized tool according to claim 1, wherein the data extraction module is to numerically model environmental conditions in the room to model the environmental condition data or extract environmental condition data from a modeling program to numerically model environmental conditions in the room.

3. The computerized tool according to claim 1, further comprising:
  an output module to visually display the layout of the one or more objects in the room determined by the layout module.

4. The computerized tool according to claim 1, further comprising:
  a temperature module for at least one of modeling and extracting temperature data in the room; and
  a thermal profile module for calculating a thermal profile of the room from the temperature data.

5. The computerized tool according to claim 4, wherein the temperature module is to numerically model the temperature conditions in the room to model the temperature data or extract the temperature data from a modeling program configured to numerically model temperature conditions in the room.

6. The computerized tool according to claim 4, wherein the room comprises a plurality of fluid moving devices and wherein the temperature module is to at least one of model and extract temperature data pertaining to respective thermal profiles associated with each of the plurality of fluid moving devices.

7. The computerized tool according to claim 6, wherein the thermal profile of each of the fluid moving devices comprises at least one of a function of the relative influence the fluid moving device has over areas in the room, an index of performance that quantifies the amount of re-circulation occurring at various locations in the room, and a measure of cooling efficiencies of a plurality of electronic devices.

8. The computerized tool according to claim 7, further comprising:
  an overlay module to overlay at least one of the calculated thermal profiles over the determined layout of the one or more objects in the room to develop at least one combined layout of the room layout and the calculated thermal profile associated with a fluid moving device; and
  a module for outputting the at least one combined layout.

9. The computerized tool according to claim 8, further comprising:
  a module to enable user interface with the at least one combined layout.

10. A method for assessing a room, said method comprising:
  obtaining environmental condition data of the room; and
  determining, with a processor, one or more areas in the room having pressure values that are equal to zero; and
  determining, with the processor, a layout of physical locations of one or more objects in the room based upon the determination of the one or more areas having pressure values that are equal to zero.

11. The method according to claim 10, wherein obtaining environmental condition data further comprises one of numerically modeling the environmental condition data and extracting environmental condition data from a numerical modeling program.

12. The method according to claim 10, further comprising:
    obtaining temperature data of the room through one of numerically modeling the temperature conditions in the room and extracting the temperature data from a modeling program configured to numerically model the temperature conditions in the room; and
    determining a thermal profile of the room based upon the temperature data.

13. The method according to claim 12, wherein the room comprises a plurality of fluid moving devices, and wherein said method further comprises obtaining temperature data pertaining to respective thermal profiles associated with each of the plurality of fluid moving devices.

14. The method according to claim 13, wherein the thermal profiles comprise at least one of a function of the relative influence each of the plurality of fluid moving devices has over areas in the room, an index of performance that quantifies the amount of re-circulation occurring at various locations in the room, and a measure of cooling efficiencies of a plurality of electronic devices.

15. The method according to claim 14, further comprising:
    overlaying graphical representations of a plurality of thermal profiles associated with the plurality of fluid moving devices on a graphical representation of the determined layout of the one or more objects in the room to thereby illustrate a relationship between the thermal profiles and the determined layout.

16. The method according to claim 12, further comprising:
    overlaying a graphical representation of the thermal profile on a graphical representation of the determined layout of the one or more objects in the room to thereby illustrate a relationship between the thermal profile and the determined layout.

17. A non-transitory computer readable storage medium on which is embedded one or more computer programs, said one or more computer programs implementing a method for visualizing a thermal profile in a room, said one or more computer programs comprising a set of instructions to:
    obtain environmental condition data of the room;
    determine one or more areas in the room having pressure values that are equal to zero;
    determine a layout of physical locations of one or more objects in the room based upon the determination of the one or more areas having pressure values that are equal to zero;
    graphically represent the determined layout;
    obtain temperature data of the room;
    determine a thermal profile of the room based upon the temperature data;
    graphically represent the thermal profile; and
    overlay the graphical representation of the thermal profile on the graphical representation of the layout of the room.

18. A computerized tool for visualizing a thermal profile in a room, said computerized tool comprising:
    a memory storing,
        a temperature module for at least one of modeling and extracting temperature data in the room;
        a thermal profile module for calculating a thermal profile of the room from the temperature data; and
        a layout module for visualizing the calculated thermal profile with respect to a layout of physical objects in the room, wherein the layout of the physical objects in the room is determined based upon a determination of locations of one or more areas in the room having pressure values that are equal to zero; and
    a processor to execute the temperature module, the thermal profile module, and the layout module.

* * * * *

UNITED STATES PATENT AND TRADEMARK OFFICE
CERTIFICATE OF CORRECTION

PATENT NO.        : 8,249,841 B1
APPLICATION NO.   : 11/699402
DATED             : August 21, 2012
INVENTOR(S)       : Ernesto J. Ferrer et al.

It is certified that error appears in the above-identified patent and that said Letters Patent is hereby corrected as shown below:

In the Claims

In column 14, lines 29-30, in Claim 5, after "program" delete "configured".

Signed and Sealed this
Twenty-eighth Day of May, 2013

Teresa Stanek Rea
*Acting Director of the United States Patent and Trademark Office*